United States Patent
Zhou et al.

(10) Patent No.: US 7,304,362 B2
(45) Date of Patent: Dec. 4, 2007

(54) MOLDED INTEGRATED CIRCUIT PACKAGE WITH EXPOSED ACTIVE AREA

(75) Inventors: Tiao Zhou, Irving, TX (US); Michael J. Hundt, Double Oak, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 483 days.

(21) Appl. No.: 10/151,656

(22) Filed: May 20, 2002

(65) Prior Publication Data

US 2003/0214021 A1    Nov. 20, 2003

(51) Int. Cl.
  *H01L 31/0203* (2006.01)
  *H01L 31/0232* (2006.01)
  *H01L 23/28* (2006.01)

(52) U.S. Cl. .............. 257/433; 257/432; 257/98; 257/787; 257/783; 257/E23.128

(58) Field of Classification Search ............... 257/98, 257/257, 432, 678, 680, 787, 788, 789, 790, 257/791, 792, 793, 794, 795, 433, 783; 438/53, 438/65, 106, 112, 116, 121, 122, 126, 127
See application file for complete search history.

(56) References Cited

U.S. PATENT DOCUMENTS

| | | | | |
|---|---|---|---|---|
| 4,894,707 A | * | 1/1990 | Yamawaki et al. | 257/680 |
| 5,399,907 A | * | 3/1995 | Nguyen et al. | 257/783 |
| 5,422,163 A | * | 6/1995 | Kamiyama et al. | 257/666 |
| 5,424,249 A | * | 6/1995 | Ishibashi | 438/51 |
| 5,622,873 A | * | 4/1997 | Kim et al. | 438/65 |
| 5,644,169 A | * | 7/1997 | Chun | 257/787 |
| 5,897,338 A | * | 4/1999 | Kaldenberg | 438/116 |
| 5,948,991 A | * | 9/1999 | Nomura et al. | 438/53 |
| 6,097,098 A | * | 8/2000 | Ball | 257/786 |
| 6,160,526 A | * | 12/2000 | Hirai et al. | 257/679 |
| 6,300,155 B1 | * | 10/2001 | Taki et al. | 438/52 |
| 6,395,585 B2 | * | 5/2002 | Brandl | 438/127 |
| 6,489,178 B2 | * | 12/2002 | Coyle et al. | 438/51 |
| 6,667,439 B2 | | 12/2003 | Salatino et al. | |
| 6,734,544 B2 | * | 5/2004 | Yan et al. | 257/690 |
| 6,838,170 B2 | * | 1/2005 | Tanaka et al. | 428/355 EP |
| 2003/0213963 A1 | * | 11/2003 | Lemoff et al. | 257/81 |
| 2003/0218237 A1 | * | 11/2003 | Hall et al. | 257/675 |

FOREIGN PATENT DOCUMENTS

JP      05-267501   * 10/1993   ............... 23/36

* cited by examiner

*Primary Examiner*—Nitin Parekh
(74) *Attorney, Agent, or Firm*—Lisa K. Jorgenson; William A. Munck

(57) ABSTRACT

An integrated circuit die having an active area that must remain exposed after packaging is secured by a compliant die attachment by which the integrated circuit die is held in position within a transfer mold during encapsulation. The compliant die attachment may comprise a flexible, compressible tape having pressure-sensitive adhesive, alone or with a rigid substrate support, or a compliant adhesive preferably applied only around a periphery of the die attach area. Deformation of the compliant die attachment under mold clamping pressure allows complete contact of the mold with the active area, preventing bleeding of the encapsulating material under the edge of a mold portion onto the active area.

20 Claims, 2 Drawing Sheets

MOLDED INTEGRATED CIRCUIT PACKAGE WITH EXPOSED ACTIVE AREA

TECHNICAL FIELD OF THE INVENTION

The present invention is directed, in general, to transfer molding during integrated circuit packaging and, more specifically, to packaging exposed active area integrated circuits in a manner tolerant of sensor surface height variations with respect to a packaging substrate on which the integrated circuit die is mounted.

BACKGROUND OF THE INVENTION

Conventional transfer molding systems employed for integrated circuit packaging generally utilize hardened steel mold surfaces to clamp onto the lead frame or packaging substrate. When the integrated circuit die being packaged requires an exposed active area after packaging (e.g., for capacitive or light sensors therein) as illustrated in FIG. 3, the mold system 300 typically includes lower and upper mold portions 301 and 302, respectively, receiving an integrated circuit die 303 mounted on a packaging substrate 304. Upper mold 302 defines a cavity 305 around integrated circuit die 303 and a portion of packaging substrate 304, with a portion of the upper mold 302 contacting the active area 306 to prevent injected encapsulating material from leaking onto that surface, leaving the active area 306 exposed after packaging.

As with other integrated circuits, sensor integrated circuit die are commonly affixed to rigid lead frames or packaging substrates by an adhesive paste. Due to the nature of the materials and the process, upper surface height variations of the integrated circuit die with respect to the lead frame or packaging substrate are inevitable. Die attach glue thickness non-uniformity from one integrated circuit package to another, or non-planarity of the adhesive for a particular integrated circuit die (exaggerated in FIG. 3), can cause imperfect contact of the upper mold with the active area, resulting in leakage of the encapsulating material onto the active area or damage to the integrated circuit die active area.

At molding, compensation for the height variations is necessary, and is typically achieved in one of several ways: compliant top mold; compliant bottom mold; or complaint material coating the clamping contact area of the integrated circuit die. However, each of these techniques is unsatisfactory in some aspect.

There is, therefore, a need in the art for alternative methods of transfer molding during packaging of exposed active area integrated circuits that either tolerates sensor surface height variations or minimizes the sensor surface height variations.

SUMMARY OF THE INVENTION

To address the above-discussed deficiencies of the prior art, it is a primary object of the present invention to provide, for use in transfer mold packaging of an integrated circuit die having an active area that must remain exposed after packaging, a compliant die attachment by which the integrated circuit die is secured in position within a transfer mold during encapsulation. The compliant die attachment may comprise a flexible, compressible tape having pressure-sensitive adhesive within the die attach area, alone or with a rigid substrate support, or a compliant adhesive preferably applied only around a periphery of the die attach area. Deformation of the compliant die attachment under mold clamping pressure allows complete contact of the mold with the active area, preventing bleeding of the encapsulating material under the edge of a mold portion onto the active area.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

Figure 1:
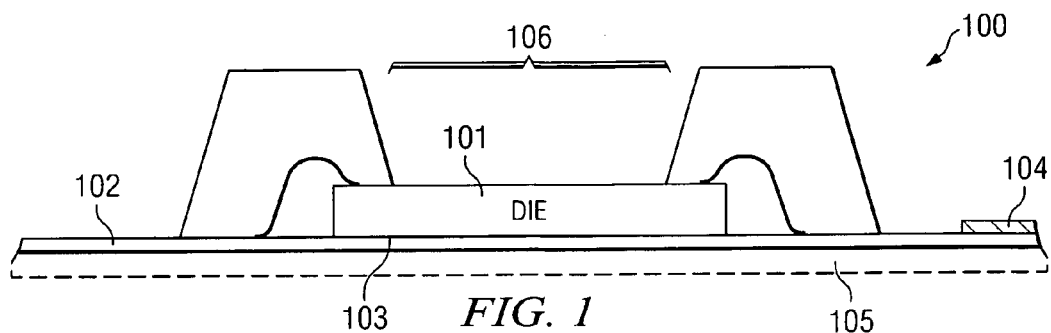
FIG. 1 depicts an integrated circuit packaging structure having a flexible substrate and film adhesive according to one embodiment of the present invention.
Figure 2A:
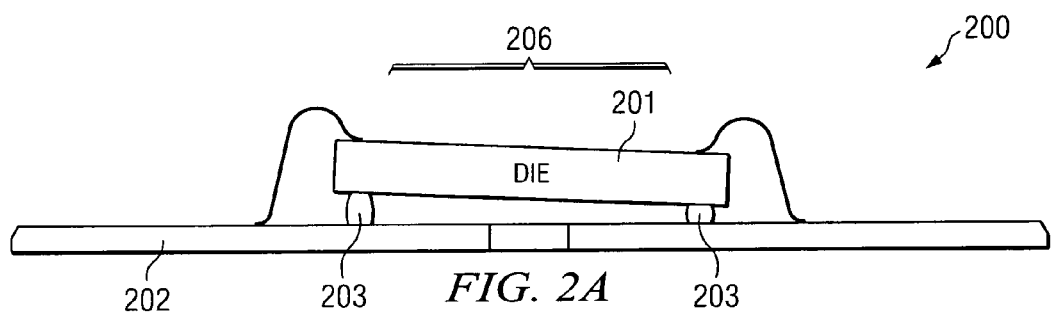
FIGS. 2A through 2C depict an integrated circuit packaging structure having a compliant die attachment according to another embodiment of the present invention.
Figure 2B:
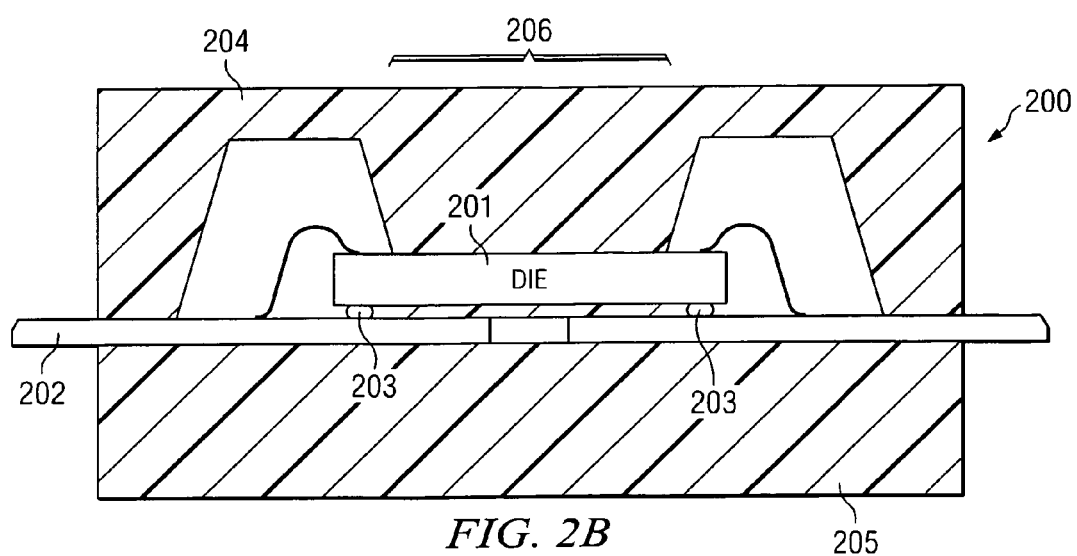
Figure 2C:
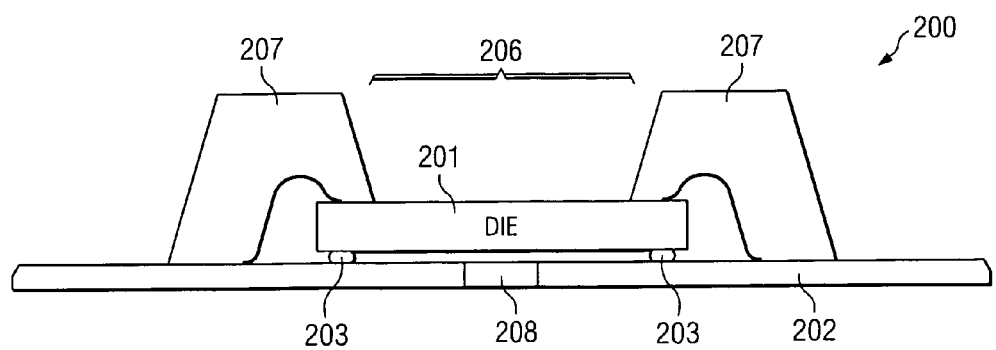
Figure 3:
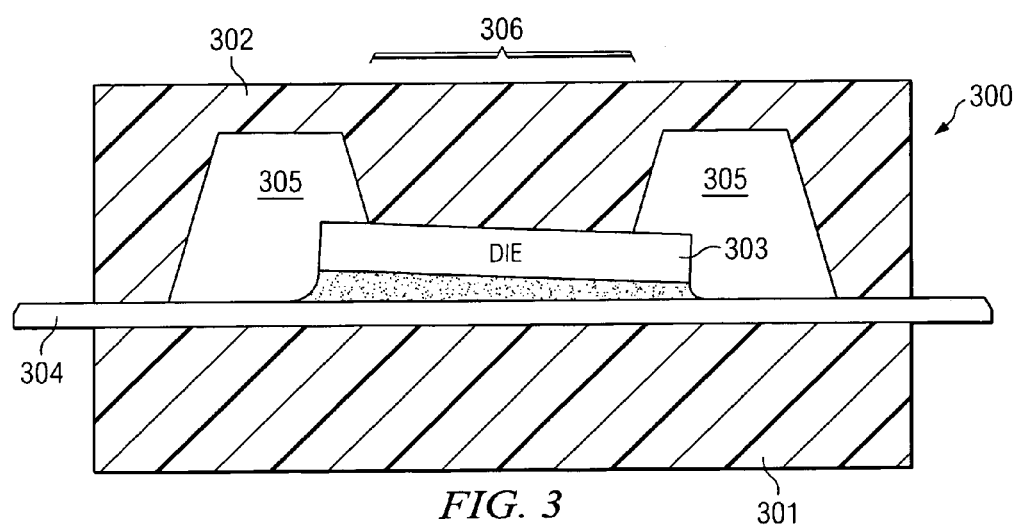
FIG. 3 depicts an integrated circuit package structure within a transfer mold.

FIGS. 1 through 2C, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

FIG. 1 depicts an integrated circuit packaging structure having a flexible substrate and film adhesive according to one embodiment of the present invention. In packaging structure 100, integrated circuit die 101 is mounted on a flexible and/or compressible substrate 102 such as a tape substrate. Compressible substrate 102 includes a pressure sensitive adhesive (PSA) 103 formed thereon and/or impregnated therein at the integrated circuit die attach (DA) area, eliminating adhesive thickness variations (no die tilt) so that conventional steel molds may be employed for transfer molding. Flexible, compressible substrate 102 also offers some compensation for surface height variations (e.g., due to varying thickness of the integrated circuit die 101) if needed.

An edge connector 104 may optionally be provided with the tape substrate 102, and the tape substrate 102 may optionally be mounted on a rigid (e.g., plastic) base 105. The active sensor area 106 remains exposed after packaging.

While the embodiment of FIG. 1 allows conventional molding techniques to be employed and optional inclusion of a flexible edge connector, tape substrates are normally expensive. In addition, the flexibility of the tape substrate 102 may pose handling difficulties.

FIGS. 2A through 2C depict an integrated circuit packaging structure having a compliant die attachment according to another embodiment of the present invention. In packaging structure 200 shown in FIG. 2A, integrated circuit die 201 having a sensor active area 106 which must remain exposed after packaging is mounted on a relatively rigid (e.g., plastic) substrate 202. However, a compliant adhesive 203 is employed, preferably only around an edge of the integrated circuit die contact area (i.e., proximate to the edge of integrated circuit die 201). Active area surface height variations from one integrated circuit to another, or active area surface height variations within one integrated circuit package (i.e., die tilt, shown exaggerated in FIG. 2A) may result.

During transfer molding, the compliant adhesive (glue) 203 deforms under clamping pressure from the upper and lower mold portions 204 and 205, as shown in FIG. 2B. Active area surface height variations are thus compensated by deformation of the compliant adhesive 203, and the portion of the upper mold 204 designed to contact the active area surface 206 uniformly and completely contacts that surface, preventing injected encapsulating material compound from seeping or bleeding onto the active area surface 206 under an edge of the contact surface for upper mold portion 204.

After encapsulation, the integrated circuit die 201 and the deformed compliant adhesive 203 tend to retain their position after removal of the mold, held in place by encapsulating material 207 as shown in FIG. 2C. A cutout or other opening 208 through the substrate 202 beneath the integrated circuit die 201 (and within the perimeter defined by compliant adhesive 203) may be employed to avoid problems such as "popcorn" cracking or delamination during solder reflow when mounted the packaged integrated circuit.

By employing a compliant die attachment, the present invention allows conventional transfer molding to be employed in packaging integrated circuits requiring an exposed active area after packaging. Deformation of the compliant die attachment allows a mold surface to uniformly and completely contact the sensor active area which must remain exposed, preventing bleeding of encapsulating material under the edge of the contacting surface onto the active area.

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. An integrated circuit package structure for exposed active area sensors comprising:
    an integrated circuit die having a surface region which must remain exposed after packaging; and
    a compliant die attachment by which the integrated circuit die is held within a transfer mold during encapsulation of the integrated circuit die;
    wherein the compliant die attachment deforms, as necessary, in response to contact of a portion of the transfer mold with the surface region which must remain exposed after packaging; and
    wherein the compliant die attachment comprises at least one of:
        a flexible and compressible substrate mounted on a rigid base, and
        a compliant adhesive disposed only at locations proximate to a periphery of the integrated circuit die.

2. The integrated circuit package structure according to claim 1, wherein the compliant die attachment comprises the flexible and compressible substrate to which the integrated circuit die is attached by an adhesive, the substrate held between portions of the transfer mold during encapsulation of the integrated circuit die.

3. The integrated circuit package structure according to claim 2, wherein the flexible and compressible substrate comprises tape and the adhesive is a pressure sensitive adhesive.

4. The integrated circuit package structure according to claim 1, wherein the compliant die attachment comprises the compliant adhesive securing the integrated circuit die to a mounting substrate held between portions of the transfer mold during encapsulation of the integrated circuit die.

5. The integrated circuit package structure according to claim 4, wherein the mounting substrate includes an opening therethrough beneath the integrated circuit die within a perimeter defined by the compliant adhesive.

6. The integrated circuit package structure according to claim 1, wherein deformation of the compliant die attachment compensates during mold clamping for surface height variations for the surface region which must remain exposed after packaging.

7. The integrated circuit package structure of claim 1, wherein the rigid base comprises a plastic base.

8. A transfer mold system for packaging exposed active area sensors comprising:
    a transfer mold having upper and lower portions;
    an integrated circuit package structure secured within the transfer mold, the integrated circuit package structure comprising:
        an integrated circuit die having a surface region which must remain exposed after packaging; and
        a compliant die attachment by which the integrated circuit die is held within the transfer mold during encapsulation of the integrated circuit die;
    wherein the compliant die attachment deforms, as necessary, in response to contact of a portion of the transfer mold with the surface region which must remain exposed after packaging; and wherein the compliant die attachment comprises at least one of:
  a flexible and compressible substrate mounted on a rigid base, and
  a compliant adhesive disposed only at locations proximate to a periphery of the integrated circuit die.

9. The transfer mold system according to claim 8, wherein the compliant die attachment comprises the flexible and compressible substrate to which the integrated circuit die is attached by an adhesive, the substrate held between portions of the transfer mold during encapsulation of the integrated circuit die.

10. The transfer mold system according to claim 9, wherein the flexible and compressible substrate comprises tape and the adhesive is a pressure sensitive adhesive.

11. The transfer mold system according to claim 8, wherein the compliant die attachment comprises the compliant adhesive securing the integrated circuit die to a mounting substrate held between portions of the transfer mold during encapsulation of the integrated circuit die.

12. The transfer mold system according to claim 11, wherein the mounting substrate includes an opening therethrough beneath the integrated circuit die within a perimeter defined by the compliant adhesive.

13. The transfer mold system according to claim 8, wherein deformation of the compliant die attachment compensates during mold clamping for surface height variations for the surface region which must remain exposed after packaging.

14. The transfer mold system of claim 8, wherein the rigid base comprises a plastic base.

15. An integrated circuit package structure, comprising:
an integrated circuit die, wherein at least a portion of a surface of the integrated circuit die must remain exposed after encapsulation of the integrated circuit die; and
a compliant die attachment capable of holding the integrated circuit die within a transfer mold during encapsulation of the integrated circuit die;
wherein the compliant die attachment deforms in response to contact of a portion of the transfer mold with the surface of the integrated circuit die; and
wherein the compliant die attachment comprises at least one of:
  a flexible and compressible substrate mounted on a rigid base, and
  a compliant adhesive disposed only along a periphery of the integrated circuit die.

16. The integrated circuit package structure of claim 15, wherein the integrated circuit die is attached to the flexible and compressible substrate by an adhesive.

17. The integrated circuit package structure of claim 16, wherein the adhesive comprises a pressure-sensitive adhesive.

18. The integrated circuit package structure of claim 15, wherein the flexible and compressible substrate comprises a flexible and compressible tape.

19. The integrated circuit package structure of claim 15, wherein the compliant die attachment prevents bleeding of an encapsulating material onto the surface of the integrated circuit die.

20. The integrated circuit package structure of claim 15, wherein the rigid base comprises a plastic base.

* * * * *

UNITED STATES PATENT AND TRADEMARK OFFICE
CERTIFICATE OF CORRECTION

PATENT NO. : 7,304,362 B2  Page 1 of 1
APPLICATION NO. : 10/151656
DATED : December 4, 2007
INVENTOR(S) : Tiao Zhou and Michael J. Hundt It is certified that error appears in the above-identified patent and that said Letters Patent is hereby corrected as shown below:

Column 4, claim 1, lines 23-24, delete "at least one of";

Column 5, claim 8, lines 3-4, delete "at least one of"; and

Column 6, claim 15, lines 12-13, delete "at least one of".

Signed and Sealed this

Ninth Day of February, 2010

David J. Kappos
*Director of the United States Patent and Trademark Office*